United States Patent
Cheng et al.

(10) Patent No.: US 9,269,850 B2
(45) Date of Patent: Feb. 23, 2016

(54) METHOD AND APPARATUS FOR FORMING COPPER(CU) OR ANTIMONY(SB) DOPED ZINC TELLURIDE AND CADMIUM ZINC TELLURIDE LAYERS IN A PHOTOVOLTAIC DEVICE

(71) Applicant: First Solar, Inc., Perrysburg, OH (US)

(72) Inventors: Long Cheng, Perrysburg, OH (US); Pawel Mrozek, Waterville, OH (US)

(73) Assignee: First Solar, Inc., Perrysburg, OH (US)

( * ) Notice: Subject to any disclaimer, the term of this patent is extended or adjusted under 35 U.S.C. 154(b) by 3 days.

(21) Appl. No.: 14/136,630

(22) Filed: Dec. 20, 2013

(65) Prior Publication Data

US 2014/0370649 A1 Dec. 18, 2014

Related U.S. Application Data (60) Provisional application No. 61/746,877, filed on Dec. 28, 2012.

(51) Int. Cl.
   *H01L 31/18* (2006.01)
   *H01L 21/02* (2006.01)
   *C25D 7/12* (2006.01)

(52) U.S. Cl.
   CPC .............. *H01L 31/1828* (2013.01); *C25D 7/12* (2013.01); *H01L 21/0248* (2013.01); *H01L 21/0251* (2013.01); *H01L 21/02411* (2013.01); *H01L 21/02505* (2013.01); *H01L 21/02562* (2013.01); *H01L 21/02579* (2013.01); *H01L 21/02628* (2013.01)

(58) Field of Classification Search
   CPC ..................................................... H01L 45/04
   See application file for complete search history.

(56) References Cited

U.S. PATENT DOCUMENTS

| | | | |
|---|---|---|---|
| 4,816,120 A | 3/1989 | Ondris et al. | |
| 8,580,603 B2 | 11/2013 | Basol | |
| 2009/0020149 A1* | 1/2009 | Woods et al. | 136/244 |
| 2010/0038638 A1* | 2/2010 | Tao et al. | 257/43 |
| 2010/0180935 A1* | 7/2010 | Chen | 136/255 |
| 2014/0113403 A1* | 4/2014 | Van Duren et al. | 438/95 |

FOREIGN PATENT DOCUMENTS

WO WO 2012/177804 A2 12/2012

OTHER PUBLICATIONS

M. Bouroushian et al., "Electrodeposition of Polycrystalline ZnTe from Simple and Citrate-Complexed Acidic Aqueous Solutions." Electrochimica Acta, vol. 54, pp. 2522-2528, 2009.

N.B. Chaure et al., "Investigation of Non-Aqueous Electrodeposited $CdS/Cd_{1-x}Zn_xTe$ Heterojunction Solar Cells." Solar Energy Materials & Solar Cells, vol. 81, pp. 39-60, 2004.

A. Bansal, et al. "Electrochemical Growth of CdZnTe Thin Films." Materials Letters, vol. 59, pp. 3666-3671, 2005.

* cited by examiner

*Primary Examiner* — Mamadou Diallo
(74) *Attorney, Agent, or Firm* — Dickstein Shapiro LLP (57) ABSTRACT

A method and apparatus for an amount of Cu or Sb dopant incorporated into a zinc-based layer as the layer is being formed. The layer is formed over a coated substrate using an electrochemical deposition (ECD) process. In the ECD process, the bias voltage and plating solution composition may be systematically changed during the electrochemical deposition process to change the amount of Cu or Sb dopant incorporated into the plated layer.

20 Claims, 9 Drawing Sheets

METHOD AND APPARATUS FOR FORMING COPPER(CU) OR ANTIMONY(SB) DOPED ZINC TELLURIDE AND CADMIUM ZINC TELLURIDE LAYERS IN A PHOTOVOLTAIC DEVICE

This application claims the benefit of priority of U.S. Provisional Patent Application No. 61/746,877, filed Dec. 28, 2012, entitled: "Method and Apparatus for Forming Copper (Cu) or Antimony (Sb) Doped Zinc Telluride Layers in a Photovoltaic Device" the entirety of which is incorporated by reference herein.

FIELD OF THE INVENTION

Disclosed embodiments relate generally to methods and apparatuses for manufacturing photovoltaic devices including photovoltaic cells and photovoltaic modules, and more particularly, to a method and apparatus for forming and controlling the composition of Cu and Sb doped zinc telluride and cadmium zinc telluride thin film layers during formation of photovoltaic devices.

BACKGROUND OF THE INVENTION

Figure 1:
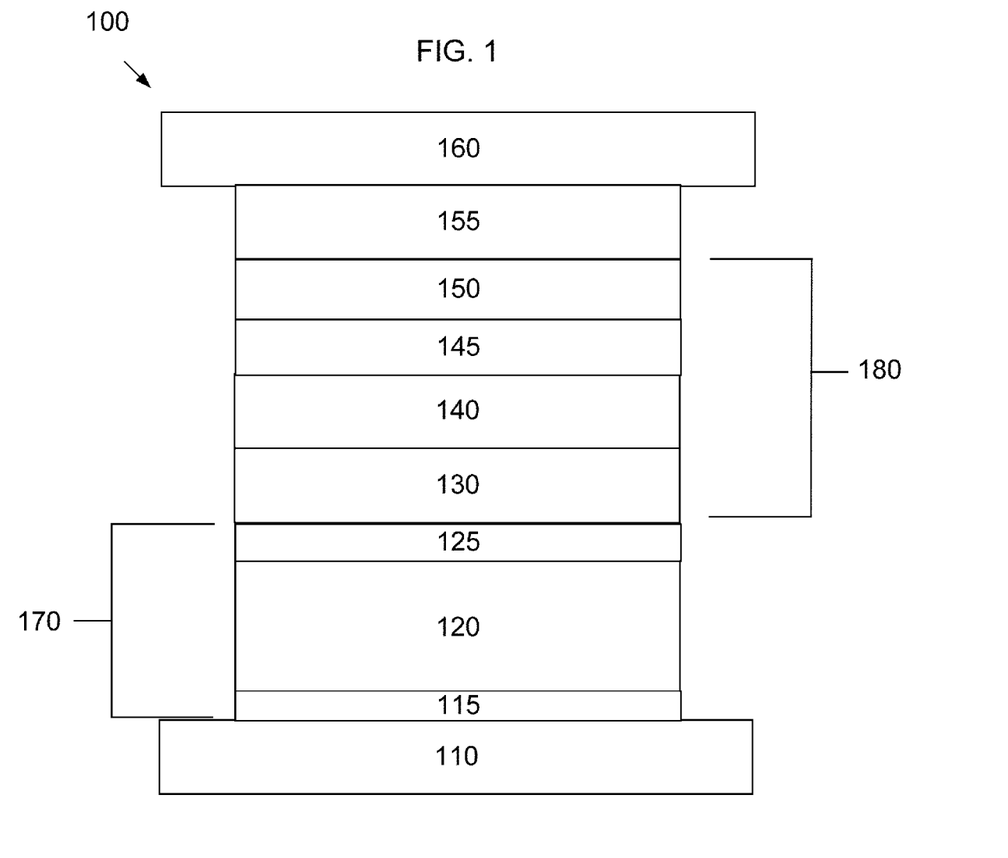
FIG. 1 is a schematic of a photovoltaic device having multiple thin film layers.

Photovoltaic devices are becoming increasingly popular for providing renewable energy. FIG. 1 shows one example of a photovoltaic device 100, which can be formed by depositing sequential thin film layers on a substrate 110. The photovoltaic device 100 may include a TCO stack 170 formed over the substrate 110, semiconductor layers 180 formed over the TCO stack 170, a back contact 155 formed over semiconductor layers 180 and a back support 160 formed over the back contact 155.

Generally, the substrate 110 is the outermost layer of a completed photovoltaic device 100 and, in use, may be exposed to a variety of temperatures and forms of precipitation, such as rain, snow, sleet, and hail. The substrate 110 may also be the first layer that incident light encounters upon reaching the photovoltaic device 100. It is therefore desirable to select a material for the substrate 110 that is both durable and highly transparent. For these reasons, the substrate 110 may include, for example, borosilicate glass, soda lime glass, or float glass.

The TCO stack 170 may include a barrier layer 115 formed on the substrate 110 for preventing sodium diffusion from the substrate 110 into the photovoltaic device. The barrier layer 115 may be formed of, for example, silicon nitride, silicon oxide, aluminum-doped silicon oxide, boron-doped silicon nitride, phosphorus-doped silicon nitride, silicon oxide-nitride, or any combination or alloy thereof. The TCO stack 170 further includes a TCO layer 120 formed on the barrier layer 115. The TCO layer 120 functions as the first of two electrodes of the photovoltaic device 100 and may be formed of, for example, fluorine doped tin oxide, cadmium stannate, or cadmium tin oxide. In addition, the TCO stack 170 includes a buffer layer 125 formed on the TCO layer 120 to provide a smooth surface for semiconductor material deposition. The buffer layer 120 may be formed of, for example, tin oxide (e.g., a tin (IV) oxide), zinc tin oxide, zinc oxide, zinc oxysulfide, and zinc magnesium oxide. It is possible to omit one or both of the barrier layer 115 and buffer layer 120 in the TCO stack 170 if desired.

Back contact 155 functions as the second of the two electrodes and may be made of one or more highly conductive materials, for example, molybdenum, aluminum, copper, silver, gold, or any combination thereof, providing a low-resistance ohmic contact. TCO layer 120 and back contact 155 are used to transport photocurrent away from photovoltaic device 100. Back support 160, which may be glass, is formed over back contact 155 to protect, together with substrate 110, photovoltaic device 100 from external hazards.

The semiconductor layers 180 may include a semiconductor window layer 130, for example, a cadmium sulfide layer, and a semiconductor absorber layer 140, for example, a cadmium telluride layer. The semiconductor layers 180 may further optionally include a transition semiconductor layer 145, for example, a cadmium zinc telluride layer, and a semiconductor reflector layer 150, for example, a zinc telluride layer. The semiconductor window layer 130 allows the penetration of solar radiation to the semiconductor absorber layer 140 which then converts solar energy to electricity through the formation of minority electron carriers. Specifically, semiconductor materials, like any other solids, have an electronic band structure consisting of a valence band, a conduction band and a band gap separating them. When an electron in the valence band acquires enough energy to jump over the band gap and reach the conduction band, it can flow freely as current. Furthermore, it will also leave behind an electron hole in the valence band that can flow as freely as current. Carrier generation describes processes by which electrons gain energy and move from the valence band to the conduction band, producing two mobile carriers: an electron and a hole; while recombination describes processes by which a conduction band electron loses energy and re-occupies the energy state of an electron hole in the valence band. In a p-type semiconductor material like the semiconductor absorber layer 140, electrons are less abundant than holes, hence they are referred to as minority electron carriers whereas holes are referred to as majority carriers.

During the conversion of solar energy to electricity at the semiconductor absorber layer 140, some minority electron carriers penetrate through the absorber layer 140 and may recombine with hole carriers, causing power dissipation inside the photovoltaic device 100, thereby reducing power conversion efficiency. Accordingly, optional semiconductor reflector layer 150 can be deposited over the semiconductor absorber layer 140 to act as a barrier or reflector against the minority electron carrier diffusion. The reflector layer 150 is formed of a semiconductor material with electron affinity lower than that of the absorber layer 140, for example, zinc telluride (ZnTe), which forces electron carrier flow back toward the electron absorber layer 140, minimizing minority electron diffusion. This is described in U.S. Provisional Patent Application 61/547,924, entitled "Photovoltaic Device And Method Of Formation," filed on Oct. 17, 2011, the disclosure of which is incorporated herein by reference.

Although optional semiconductor reflector layer 150 reduces power dissipation and increases power conversion efficiency in the photovoltaic device 100, lattice mismatch may occur between the semiconductor reflector layer 150 and the semiconductor absorber layer 140, which can partially negate this benefit. In general, semiconductor materials contain a lattice, or a periodic arrangement of atoms specific to a given material. Lattice mismatching refers to a situation wherein two materials featuring different lattice constants (a parameter defining the unit cell of a crystal lattice, that is, the length of an edge of the cell or an angle between edges) are brought together by deposition of one material on top of another. In general, lattice mismatch can cause film growth against the natural grain of the adjacent film, film cracking, and creation of point defects at the interface between the two materials featuring the different lattice constants.

To reduce the effects of lattice mismatch between the semiconductor absorber layer 140 and the semiconductor reflector layer 150, the optional semiconductor transition layer 145, formed of a combination of the semiconductor absorber material and the semiconductor reflector material, for example, a Cd(1-x)Zn(x)Te layer where 0<x<1, may be formed between the semiconductor absorber layer 140 and the semiconductor reflector layer 150. By virtue of its composition, the semiconductor transition layer 145 has a lattice constant between that of the semiconductor absorber layer 140 and the semiconductor reflector layer 150, which reduces lattice mismatch between the two layers and increases the electronic conversion efficiency of the photovoltaic device 100.

Forming the semiconductor reflector layer 150 and the semiconductor transition layer 145 in a photovoltaic device may be hindered by the intrinsic nature of the combined semiconductor materials that compose the two layers, for example, cadmium (Cd), zinc (Zn) and telluride (Te). Specifically, ZnTe and CdZnTe are highly resistive films, which can cause flaws to form in the semiconductor reflector layer 150 and/or the semiconductor transition layer 145 as they are formed over other semiconductor layers, for example, a cadmium telluride layer 140. Incorporating conductive dopant into the ZnTe and CdZnTe layers can increase the conductivity and decrease the resistivity of these layers, which reduces the flaws that may occur during formation and provides the electrical properties necessary for the layers to function in a photovoltaic device. Accordingly, a method and apparatus for incorporating conductive dopant into zinc telluride and cadmium zinc telluride thin film layers during formation of photovoltaic devices is desired.

DETAILED DESCRIPTION OF THE INVENTION

In the following detailed description, reference is made to the accompanying drawings which form a part hereof, and which illustrate specific embodiments of the invention. These embodiments are described in sufficient detail to enable those of ordinary skill in the art to make and use them. It is also understood that structural, logical, or procedural changes may be made to the specific embodiments disclosed herein without departing from the spirit or scope of the invention.

Disclosed herein are embodiments of a method and apparatus for incorporating and controlling an amount of conductive dopant, such as Cu or Sb dopant, incorporated into zinc-based semiconductor layers as the layers are being formed over a partially completed photovoltaic device. To form the layers, an electrochemical deposition (ECD) system is used. In ECD systems, a plating solution is used that contains materials that make up the layer to be formed by the ECD process. By adding a dopant into the plating solution along with the layer materials, the plated layer will be doped in-situ during its formation. This is a rather efficient method of doping layers. The method increases control over the dopant concentration throughout the doped zinc-based semiconductor layer. It also eliminates any need for additional annealing steps, which at times may damage previously formed layers of the photovoltaic device.

The method may further include, if desired, systematically changing, in a step-wise or gradual fashion, one, a few or all variables in a set of ECD variables while forming the zinc-based layers. Systematically changing the ECD variables creates a controlled step-wise or gradual change in the amount of dopant that will be incorporated into the zinc-based layers as they get farther from the initial deposition surface of the partially completed photovoltaic device.

Figure 2A:
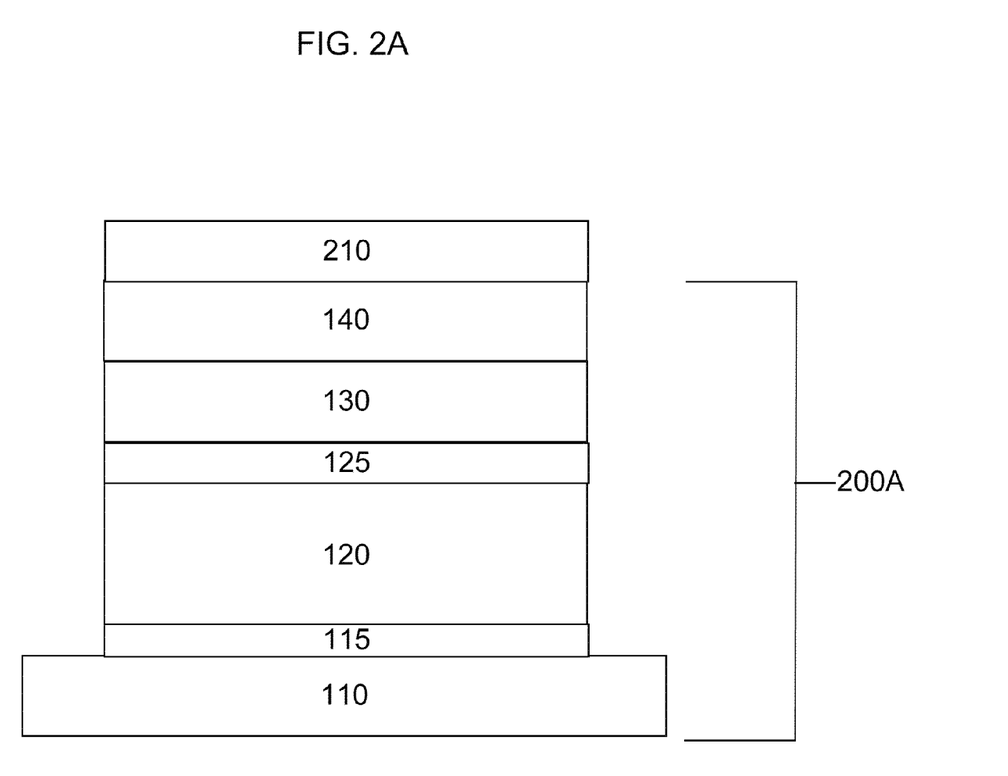
FIGS. 2A-2B are schematics of a zinc-based semiconductor layer formed over a partially completed photovoltaic device.

FIG. 2A illustrates a zinc-based semiconductor layer 210 formed over a partially completed photovoltaic device 200A. The partially completed photovoltaic device 200A includes a substrate 110 and thin film layers 115, 120, 125, 130, 140 deposited sequentially thereon as described in FIG. 1. The doped zinc-based semiconductor layer 210 may be formed on the semiconductor absorber layer 140. The layer, in this particular example, may be a Cu or Sb doped cadmium zinc telluride (Cu:CZT or Sb:CZT) layer 145 or a Cu or Sb doped zinc telluride reflector layer (Cu:ZnTe or Sb:CZT) 150 as described in reference to the example photovoltaic device 100 shown in FIG. 1.

The layer being formed may be a transition layer. A transition layer is a layer in which the concentration of an element/material transitions from one concentration of an element at one surface of the layer to a different concentration of the element at the other surface. In this case, if the Cu or Sb doped zinc-based semiconductor layer 210 is a Cu:CZT or Sb:CZT transition layer 145, then the CZT portion of the layer may be formed of one or several Cd(1-x)Zn(x)Te layers where x defines any suitable number between 0 and 1 and the zinc/cadmium mole ratio changes either step-wise, gradually or randomly as it gets farther from the semiconductor absorber layer 140.

Figure 3A:
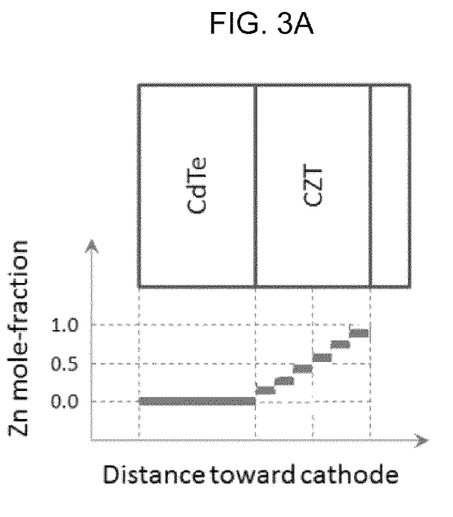
FIGS. 3A-3B illustrates two possible mole fraction profiles for CZT transition layers in various photovoltaic device configurations.
Figure 3B:
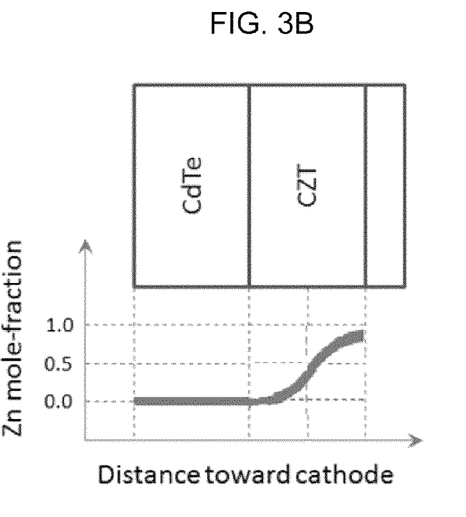

FIGS. 3A and 3B illustrate two possible zinc/cadmium mole-fraction profiles that can be used to form the transition layer 145. In FIG. 3A, a step-wise increase of a zinc mole-fraction in the CZT transition layer 145 from 0 to 1 is used, whereas in FIG. 3B a gradual increase of the zinc mole-fraction is used. It should be noted that FIGS. 3A and 3B are only examples of possible zinc/cadmium mole-fraction profiles and that the CZT transition layer 145 can have any desired mole-fraction profile.

Figure 2B:
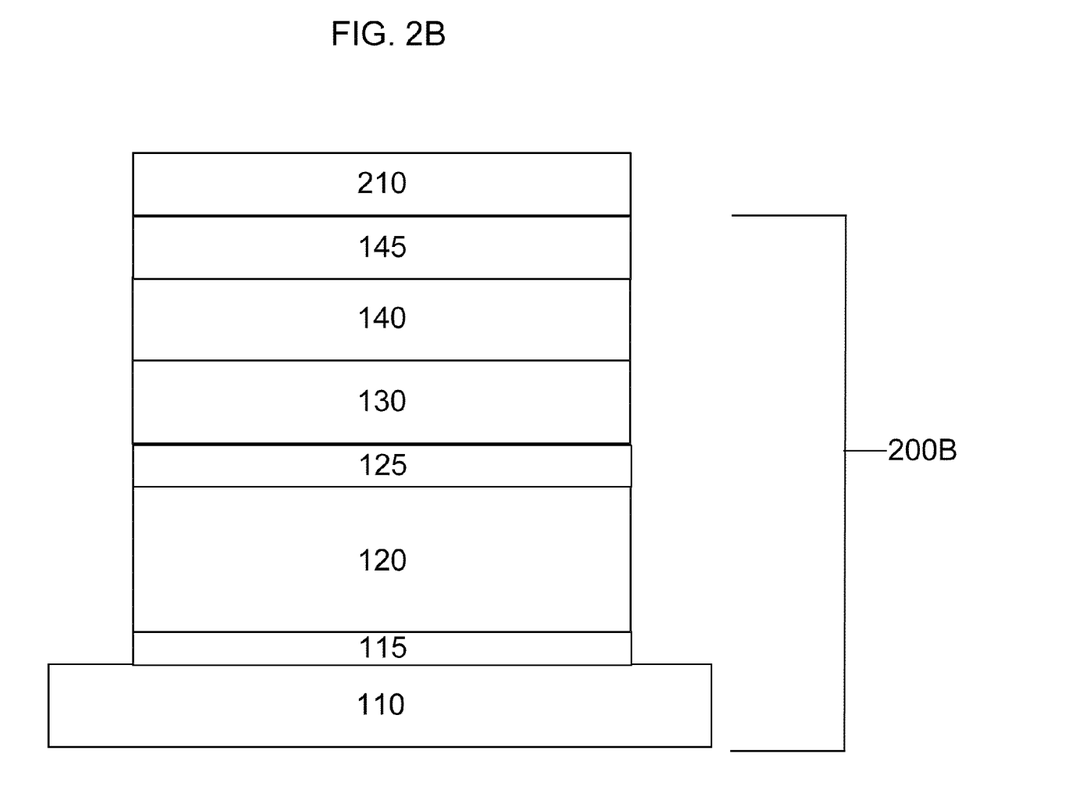

If the Cu or Sb doped zinc-based semiconductor layer 210 is a Cu:ZnTe or Sb:ZnTe reflector layer 150, then the Cu or Sb doped zinc-based semiconductor layer 210 may be formed on a partially completed photovoltaic device 200A without a CZT transition layer 145, as shown in FIG. 2A or, alternatively, on a partially completed photovoltaic device 200B having the CZT transition layer 145 as shown in FIG. 2B. Partially completed photovoltaic device 200B may include a substrate 110 and thin film layers 115, 120, 125, 130, 140, 145 deposited sequentially on the substrate 110 as described in reference to the example photovoltaic device 100 shown in FIG. 1. The Cu or Sb doped zinc-based semiconductor layer 210, which, in the embodiment shown in FIG. 2B is a Cu:ZnTe or Sb:ZnTe reflector layer 150, may be deposited over the CZT transition layer 145.

Figure 4:
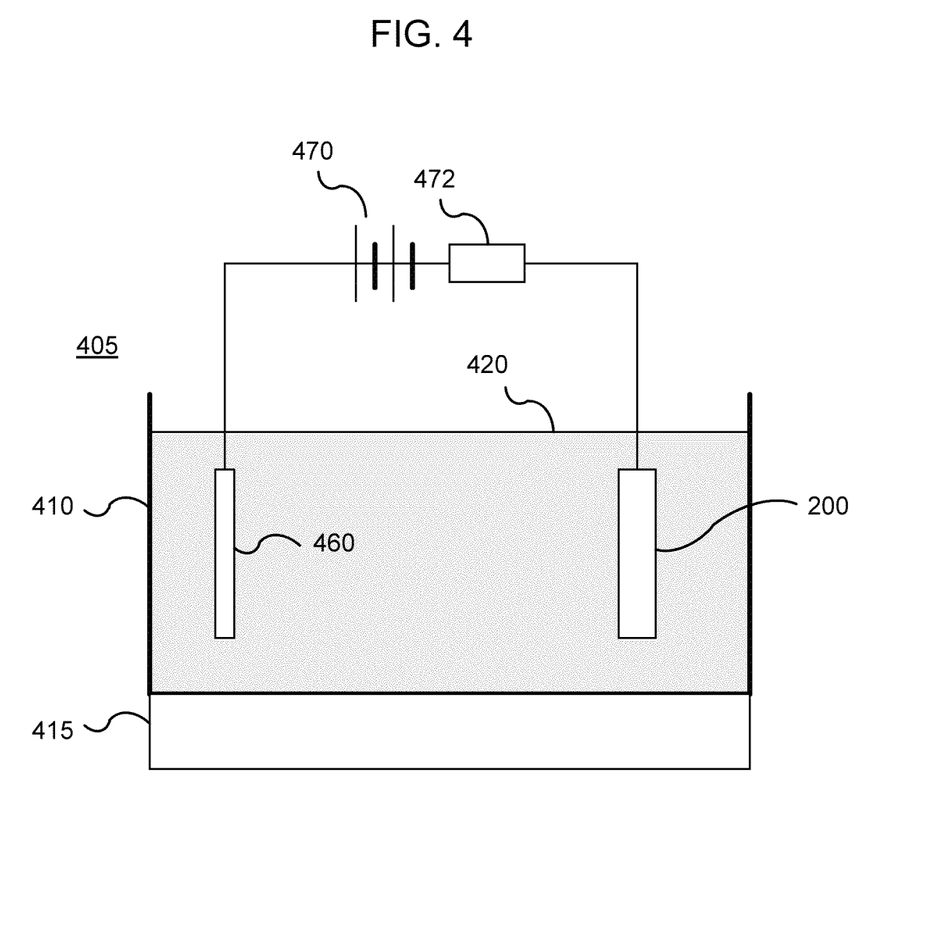
FIG. 4 illustrates a schematic of an ECD unit for incorporating a dopant into a zinc-based semiconductor layer as it is formed over a partially completed photovoltaic device.

FIG. 4 illustrates an ECD unit 405 for incorporating Cu or Sb dopant in a Cu or Sb doped zinc-based semiconductor layer 210 as it is formed over a partially completed photovoltaic device 200. It should be noted regarding all embodiments described herein, partially completed photovoltaic device 200, as shown in FIG. 4, may refer to either partially completed photovoltaic device 200A, as shown in FIG. 2A or partially completed photovoltaic device 200B, as shown in FIG. 2B or some other partially completed photovoltaic device structure. Referring to FIG. 4, ECD unit 405 may include a container 410, a heater 415, associated with, e.g., under, the container 410, and plating solution 420 in the container 410. When contacted with plating solution 420, partially completed photovoltaic device 200 is electrically connected to power source 470, which may have a positive terminal and a negative terminal. The partially completed photovoltaic device 200 is most often connected to the negative terminal and acts as a cathode in the ECD unit 405. A complementary electrode 460 which may be made of any appropriate electrode material known in the art, for example, carbon, stainless steel, platinum or any inert material, is electrically connected to the other terminal of the power source 470 and serves as an anode in the ECD unit 405.

In use, the power source 470 supplies an external ECD bias voltage across the partially completed photovoltaic device 200 and the plating solution 420. The ECD bias voltage may be any predetermined bias voltage suitable for ECD, for example, a bias voltage in the range of about $-0.3$ V to about $-10$ V. It should be noted that the ECD bias voltages disclosed herein are cathodic voltages measured across the partially completed photovoltaic device 200 and the complementary electrode 460 and at the complementary electrode 460. In some embodiments, the ECD bias voltage may be in the range of about $-0.6$ V to $-2$ V. In other embodiments, the ECD bias voltage may be in the range of about $-0.9$ V and $-1.5$ V. The power source 470 may have a control unit 472, which may be capable of changing the ECD bias voltage across the partially completed photovoltaic device 200 and the plating solution 420 during ECD.

When an ECD bias voltage is applied across the partially completed photovoltaic device 200 and the plating solution 420, solutes of interest are attracted from the plating solution 420 to the partially completed photovoltaic device 200 and form a Cu or Sb doped zinc-based semiconductor layer 210 over the partially completed photovoltaic device 200. The plating solution 420 may contain one or more Cu or Sb dopant, one or more complexing agents, which are compounds that chemically interact with the dopant as the dopant is incorporated into the plated Cu or Sb doped zinc-based semiconductor layer 210, and one or more semiconductor solute(s) to form the Cu or Sb doped zinc-based semiconductor layer 210, all dissolved in any appropriate solvent, such as water or a mixture of water and other water-soluble solvents.

The Cu or Sb dopant may be any soluble Cu or Sb containing compounds that can be reduced or incorporated into a semiconductor layer. For example, the Cu dopant may be copper sulfide, copper sulfate, copper chloride, copper fluoride, cooper nitrate, copper phosphate, or copper citrate. The Sb dopant may be antimony sulfide, antimony sulfate, antimony chloride, antimony fluoride, antimony nitrate, antimony phosphate or antimony citrate. The Cu or Sb dopant compounds may be dissolved in the plating solution 420 to form ions or electrolytes that can be reduced, oxidized, or deposited to be incorporated into the plated Cu or Sb doped zinc-based semiconductor layer 210. The dopant concentration in plating solution 420 may be set based on the desired composition of the layer. For example, in some embodiments, the plating solution 420 may have Cu or Sb concentration in the range of about 0.01 mM (millimolar) to about 10 M (molar). In other embodiments, the plating solution 420 may have a Cu or Sb concentration in the range of about 1 mM to about 100 mM. In other embodiments, plating solution 420 may have a Cu or Sb concentration in the range of about 5 mM to about 50 mM.

The complexing agents may be soluble compounds that coordinate or position Cu or Sb dopant in the plating solution for incorporation into the Cu or Sb doped zinc-based semiconductor layer 210 as it is plated on the partially completed photovoltaic device 200. For example, the complexing agent may be citrate, phenathroline, thiocyanate, halides, pyridines, and their derivatives.

The semiconductor solutes may be any suitable material(s) for forming a plated Cu or Sb doped zinc-based semiconductor layer 210 over the partially completed photovoltaic device 200. The solutes may be dissolved in plating solution 420 as ions or electrolytes that can be reduced, oxidized, or deposited to form a plated Cu or Sb doped zinc-based semiconductor layer 210. For example, if the doped zinc-based semiconductor layer 210 is a Cu:ZnTe or Sb:ZnTe reflector layer 150, the plating solution 420 may include solutes of zinc (Zn) and telluride (Te). Alternatively, if the doped zinc-based semiconductor layer 210 is a Cu:CZT or Sb:CZT transition layer 145, the plating solution 420 may include solutes of cadmium (Cd), zinc(Zn) and telluride (Te). The concentrations of each solute can be determined based on the desired composition of the plated Cu or Sb doped zinc-based semiconductor layer 210. For example, if the doped zinc-based semiconductor layer 210 is a Cu:ZnTe or Sb:ZnTe reflector layer 150, an exemplary plating solution 420 may have a zinc concentration in the range of about 0.1 M to about 10 M and a telluride concentration in the range of about 0.1 M to about 10 M. Alternatively, if the doped zinc-based semiconductor layer 210 is a Cu:CZT or Sb:CZT transition layer 145, the plating solution 420 may have a cadmium concentration of about 0.1 M to about 10 M, a zinc concentration in the range of about 0.1 M to about 10 M and a telluride concentration in the range of about 0.1 M to about 10 M. The plating solution 420 may have a pH of about 0 to about 14. In some embodiments, plating solution 420 has a pH of about 1 to about 7, or about 2 to about 4. In other embodiments, plating solution 420 has a pH of about 7 to about 14, or about 9 to about 12. In still other embodiments, plating solution 420 has a pH of about 5 to about 9, or about 6 to about 8.

ECD unit 405 can function at a predetermined temperature, for example, heater 415 may heat the plating solution 420 to a temperature of about 10° C. to about 100° C., about 10° C. to about 50° C., about 15° C. to about 30° C., about 25° C., or room temperature. During the plating process, power source 470 may generate an ECD bias voltage for a predetermined length of time, including about 5 seconds to about 100,000 seconds, about 50 seconds to about 7,500 seconds, about 100 seconds to about 750 seconds, and about 100 seconds to about 500 seconds. The length of time that the ECD bias voltage is applied across the partially completed photovoltaic device 200 and the plating solution 420 may determine the thickness of the plated Cu or Sb doped zinc-based semiconductor layer 210. Accordingly, the length of time can be chosen to be sufficient to form the doped zinc-based semiconductor layer 210 over the partially completed photovoltaic device 200 having any desirable thickness, for example, between about 0 nm and about 3000 nm. In some embodiments, the doped zinc-based semiconductor layer 210 may have a thickness of between about 5 nm and 500 nm. In other embodiments, the doped zinc-based semiconductor layer 210, may have a thickness of between about 10 nm to about 100 nm.

After the plated Cu or Sb doped zinc-based semiconductor layer 210 is completely formed over the partially completed photovoltaic device 200, the partially completed photovoltaic device 200 may be removed from plating solution 420. Partially completed photovoltaic device 200 may then be washed, and additional layers may be formed over the Cu or Sb doped zinc-based semiconductor layer 210 formed on the partially completed photovoltaic device 200 if desired.

It is important to recognize that the ECD bias voltage generated by the power source 470 and the composition of the plating solution 420 are variables in the ECD process that may determine the amount of Cu or Sb dopant incorporated into the Cu or Sb doped zinc-based semiconductor layer 210 as it is formed on the partially completed photovoltaic device 200. Certain conditions have been found to incorporate a high percentage of Cu or Sb dopant into a plated layer, for example, about 3% to about 30% incorporation of the Cu dopant or about 12% to about 80% incorporation of the Sb dopant from the plating solution 420, while other conditions have been found to incorporate a low percentage of Cu or Sb dopant into a plated layer, for example, about 0.0001% to about 3% incorporation of the Cu dopant or about 0.5% to about 12% incorporation of the Sb dopant from the plating solution 420, during ECD. Referring specifically to ECD bias voltage, performing the ECD process at a bias voltage of, for example, about −0.9 V incorporates a high percentage of Cu or Sb dopant into a plated layer, for example, about 3% to about 30% incorporation of the Cu dopant or about 12% to about 80% incorporation of the Sb dopant. Conversely, performing the ECD process at a bias voltage of, for example, about −1.1 V incorporates a low percentage of Cu or Sb dopant into a plated layer, for example, about 0.0001% to about 3% incorporation of the Cu dopant or about 0.5% to about 12% incorporation of the Sb dopant.

Referring specifically to plating solution composition, the concentration of Cu or Sb dopant in the plating solution 420 has a direct correlation to the amount of dopant incorporated into the plated Cu or Sb doped zinc-based semiconductor layer 210 formed over the partially completed photovoltaic device 200. If the concentration of dopant in the plating solution 420 is low, for example, 0.01 mM to about 100 mM, than the percent of dopant incorporated into the plated Cu or Sb doped zinc-based semiconductor layer 210 will be low, for example, about 0.0001% to about 3% incorporation of the Cu dopant or about 0.5% to about 12% incorporation of the Sb dopant. Conversely, if the concentration of dopant in the plating solution 420 is high, for example, 100 mM to about 10 M, than the amount of dopant incorporated into the plated Cu or Sb doped zinc-based semiconductor layer 210 will be high, for example, about 3% to about 30% incorporation of the Cu dopant or about 12% to about 80% incorporation of the Sb dopant.

Figure 5:
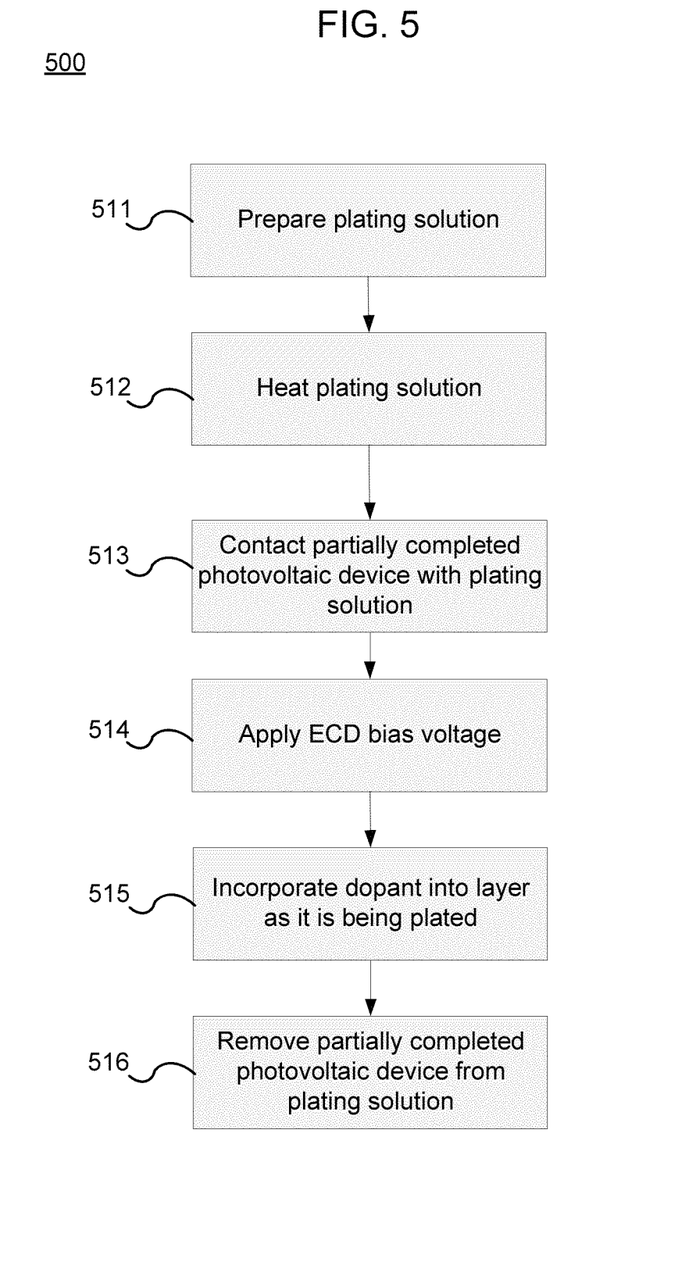
FIG. 5 illustrates a flow chart of an ECD plating process for incorporating a dopant into a zinc-based semiconductor layer as it is formed over a partially completed photovoltaic device.

FIG. 5 illustrates a flow chart of an ECD plating process 500 with steps 511-516, where an ECD unit 405, as shown in FIG. 4, may be used to incorporate Cu or Sb dopant into a Cu or Sb doped zinc-based semiconductor layer 210 as it is formed on a partially completed photovoltaic device 200 and where the ECD bias voltage is used to establish the amount of dopant incorporated into the plated layer. In step 511, a plating solution 420 is prepared, which includes a solvent, for example, water, a Cu or Sb dopant compound dissolved in the solvent, a complexing agent, for example, citrate, dissolved in the water and a zinc-based semiconductor solute mixture dissolved in the water. To form a Cu or Sb doped zinc-based semiconductor layer 210 that is a Cu:ZnTe or Sb:ZnTe reflector layer 150, the zinc-based semiconductor solute mixture may include, for example, zinc, and telluride ions or electrolytes, as a solute dissolved in the solvent, in a predetermined ratio for deposition of a Cu:ZnTe or Sb:ZnTe reflector layer 150. To form a Cu or Sb doped zinc-based semiconductor layer 210 that is a Cu:CZT or Sb:CZT transition layer 145, the zinc-based semiconductor solute mixture may include, for example, cadmium, zinc, and telluride ions or electrolytes, as a solute dissolved in the solvent, in a predetermined ratio for deposition of a Cu:CZT or Sb:CZT transition layer 145. In step 512, a heater 415 heats the plating solution 420 to a predetermined temperature for deposition of the Cu or Sb doped zinc-based semiconductor layer 210, for example, a temperature in the range of about 10° C. to about 100° C. In step 513, a partially completed photovoltaic device 200 is contacted with the heated plating solution 420 in container 410. In step 514, power source 470 generates an ECD bias voltage across partially completed photovoltaic device 200 and plating solution 420. The ECD bias voltage may be a predetermined bias voltage in the range of about −0.3 V to about −10 V and may be set based on the desired amount of the Cu or Sb dopant. For example, the ECD bias voltage may be set at about −0.9 V to incorporate a high percentage of Cu or Sb dopant into the plated layer, for example, about 3% to about 30% incorporation of the Cu dopant or about 12% to about 80% incorporation of the Sb dopant. Alternatively, the ECD bias voltage may be set at about −1.1 V to incorporate a low percentage of Cu or Sb dopant into the plated layer, for example, about 0.0001% to about 3% incorporation of the Cu dopant or about 0.5% to about 12% incorporation of the Sb dopant. In step 515, the ECD bias voltage may be applied for a predetermined period of time, for example, about 5 seconds to about 100,000 seconds, to plate the Cu or Sb doped zinc-based semiconductor layer 210 on the partially completed photovoltaic device 200. In step 516, the partially completed photovoltaic device 200 with the newly plated Cu or Sb doped zinc-based semiconductor layer 210 is removed from the plating solution 420. It should be noted that the steps 511-516 shown in FIG. 5 describe the steps in ECD plating process 500, but do not necessarily indicate any particular order or sequence of steps.

ECD unit 405 may also be operated by systematically changing the ECD bias voltage during the predetermined time allotted for plating the Cu or Sb doped zinc-based semiconductor layer 210, which changes the amount of Cu or Sb dopant incorporated into the Cu or Sb doped zinc-based semiconductor layer 210 as it gets farther from the partially completed photovoltaic device 200. Generally speaking, the initial plating conditions may be set such that either a high or low amount of the dopant is initially incorporated into the Cu or Sb doped zinc-based semiconductor layer 210 and then the ECD plating condition may be changed in a stepwise or gradual fashion during the plating process so that the amount of Cu or Sb dopant incorporated into the plated Cu or Sb doped zinc-based semiconductor layer 210 either increase or decreases as it gets father from the partially completed photovoltaic device 200.

It should be noted that when the Cu or Sb doped zinc-based semiconductor layer 210 being formed in the ECD plating process is a Cu:CZT or Sb:CZT transition layer 145, systematically changing the ECD bias voltage during the plating process also changes the semiconductor composition of the Cu:CZT or Sb:CZT transition layer 145 as it is plated. Specifically, changing the ECD bias voltage changes the ratio of zinc solutes to cadmium solutes in the plated layer. For example, performing the ECD process at a bias voltage of, for example, about −0.9 V favors incorporation of cadmium solutes into the plated layer over incorporation of zinc solutes. Conversely, performing the ECD process at a voltage of, for example, about −1.2 V favors incorporation of zinc solutes into the plated layer over incorporation of cadmium solutes. Thus, systematically changing the ECD bias voltage during the predetermined time will change the amount of Cu or Sb dopant incorporated into the Cu:CZT or Sb:CZT transition layer 145 and it will change the zinc solute to cadmium solute ratio in the Cu:CZT or Sb:CZT transition layer 145.

Figure 6:
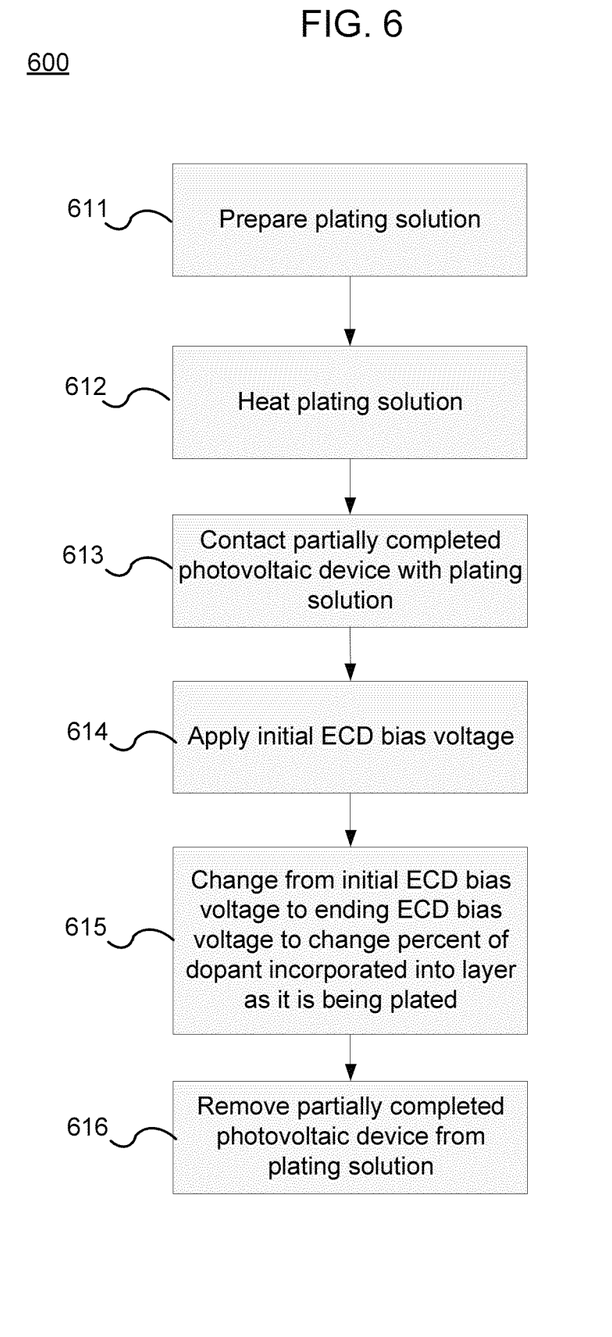
FIG. 6 illustrates a flow chart of an ECD plating process where ECD bias voltage is changed during the plating process to change the amount of dopant incorporated into the zinc-based semiconductor layer as it is formed over a partially completed photovoltaic device.

FIG. 6 illustrates a flow chart of an ECD plating process 600 with steps 611-616, where and ECD unit 405, as shown in FIG. 4, may be used to incorporate Cu or Sb dopant into a Cu or Sb doped zinc-based semiconductor layer 210 as it is formed on a partially completed photovoltaic device 200 and where changing the ECD bias voltage during the plating process is used to change the amount of dopant incorporated into the Cu or Sb doped zinc-based semiconductor layer 210 as it get farther from the partially completed photovoltaic device 200. In step 611, a plating solution 420 is prepared, which includes a solvent, for example, water, a Cu or Sb dopant compound dissolved in the solvent, a complexing agent, for example, citrate, dissolved in the water and a zinc-based semiconductor solute mixture dissolved in the water. To form a Cu or Sb doped zinc-based semiconductor layer 210 that is a Cu:ZnTe or Sb:ZnTe reflector layer 150, the zinc-based semiconductor solute mixture may include, for example, zinc, and telluride ions or electrolytes, as a solute dissolved in the solvent, in a predetermined ratio for deposition of a Cu:ZnTe or Sb:ZnTe reflector layer 150. To form a Cu or Sb doped zinc-based semiconductor layer 210 that is a Cu:CZT or Sb:CZT transition layer 145, the zinc-based semiconductor solute mixture may include, for example, cadmium, zinc, and telluride ions or electrolytes, as a solute dissolved in the solvent, in a predetermined ratio for deposition of a Cu:CZT or Sb:CZT transition layer 145. In step 612, a heater 415 heats the plating solution 420 to a predetermined temperature for deposition of the Cu or Sb doped zinc-based semiconductor layer 210, for example, a temperature in the range of about 10° C. to about 100° C. In step 613, a partially completed photovoltaic device 200 is contacted with the heated plating solution 420 in container 410. In step 614, power source 470 generates an initial ECD bias voltage across partially completed photovoltaic device 200 and plating solution 420. The initial ECD bias voltage may be a predetermined bias voltage in the range of about −0.3 V to about −10 V and may be set based on the desired initial amount of Cu or Sb dopant. For example, the ECD bias voltage may be set at about −0.9 V to incorporate a high percentage of Cu or Sb dopant into the plated layer, for example, about 3% to about 30% incorporation of the Cu dopant or about 12% to about 80% incorporation of the Sb dopant. Alternatively, the ECD bias voltage may be set at about −1.1 V to incorporate a low percentage of Cu or Sb dopant into the plated layer, for example, about 0.0001% to about 3% incorporation of the Cu dopant or about 0.5% to about 12% incorporation of the Sb dopant. Again, it should be noted, that if the doped zinc-based semiconductor layer 210 being plated is a Cu:CZT or Sb:CZT transition layer 145, then performing the ECD process at a bias voltage of about −0.9 V favors incorporation of cadmium solutes into the plated layer over incorporation of zinc solutes. Conversely, performing the ECD process at a voltage of, for example, about −1.2 V favors incorporation of zinc solutes into the plated layer over incorporation of cadmium solutes.

In step 615, the control unit 472 changes the applied ECD bias voltage from the initial ECD bias voltage to an ending ECD bias voltage in order to modulate dopant incorporation percentage. If a low to high dopant concentration profile is desired, the initial ECD bias voltage can be set relatively high, for example −1.1 V, to favor lower dopant incorporation at the beginning of the plating, for example, about 0.0001% to about 3% Cu dopant incorporation or about 0.5% to about 12% incorporation of the Sb dopant. If a high to low dopant concentration profile is desired, the initial ECD bias voltage can be set relatively low, for example −0.3 V, to favor higher dopant incorporation at the beginning of the plating, for example, about 3% to about 30% incorporation of the Cu dopant or about 12% to about 80% incorporation of the Sb dopant. The control unit 472 may then change the initial ECD bias voltage to an ending ECD bias voltage that favors the opposite dopant incorporation in a step-wise, gradual or random fashion. In step 616, the partially completed photovoltaic device 200 with the newly plated Cu or Sb doped zinc-based semiconductor layer 210 is removed from the plating solution 420. Again, it should be noted that the steps 611-616 shown in FIG. 5 describe the steps in ECD plating process 800, but do not necessarily indicate any particular order or sequence of steps.

Figure 7:
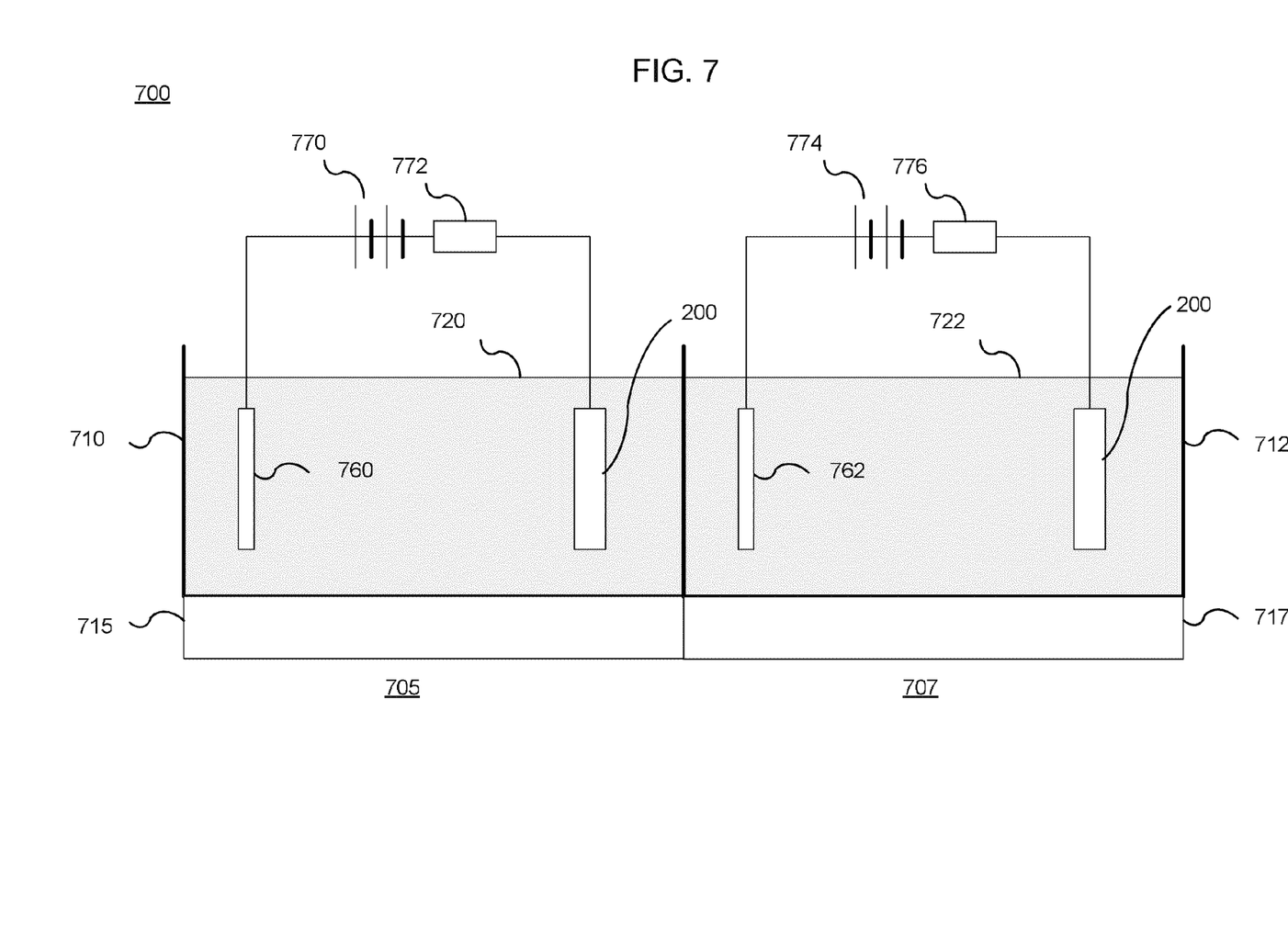
FIG. 7 illustrates a schematic of an ECD system having two ECD units for incorporating a dopant into a zinc-based semiconductor layer as it is formed over a partially completed photovoltaic device.

In other embodiments, it may be desirable to use multiple plating solutions having different compositions to change the amount of Cu or Sb dopant that is incorporated into the Cu or Sb doped zinc-based semiconductor layer 210 during the ECD process. FIG. 7 shows an ECD system 700 which may include multiple ECD units 705, 707. Although two ECD units are shown in FIG. 7, any number of ECD units may be used. As described with reference to the single ECD unit 405 shown in FIG. 4, first and second ECD units 705, 707 may include first and second containers 710, 712, first and second heaters 715, 717 associated with, e.g., positioned under, the first and second containers 710, 712 respectively and first and second plating solutions 720, 722 in first and second containers 710, 712 respectively. First and second plating solutions 720, 722 may have different Cu or Sb dopant concentrations. Accordingly, first and second ECD units 705, 707 may be used in combination to form a Cu or Sb doped zinc-based semiconductor layer 210 over a partially completed photovoltaic device 200 with a different amount of Cu or Sb dopant incorporated into the Cu or Sb doped zinc-based semiconductor layer 210 as it moves away from the partially completed photovoltaic device 200.

When contacted with the first plating solution 720, partially completed photovoltaic device 200 is electrically connected to a first power source 770, which may have a positive terminal and a negative terminal. The partially completed photovoltaic device 200 is electrically connected to the negative terminal of the first power source 770 and may act as a cathode in first ECD unit 705. A first complementary electrode 760, which may be made of any appropriate electrode material known in the art, is electrically connected to the positive terminal of the first power source 770 and may act as an anode in the first ECD unit 705. In use, the first power source 770 generates an external ECD bias voltage across partially completed photovoltaic device 200 and first plating solution 720. The first power source 770 may have a first control unit 772, which may be capable of changing the ECD bias voltage across the partially completed photovoltaic device 200 and the first plating solution 720 during ECD. Solutes from first plating solution 720 are attracted to partially completed photovoltaic device 200 and form a first portion of the Cu or Sb doped zinc-based semiconductor layer 210 over the partially completed photovoltaic device 200. Then the partially completed photovoltaic device 200 is removed from first plating solution 720 and contacted with second plating solution 722.

When contacted with the second plating solution 722, partially completed photovoltaic device 200 is electrically connected to a second power source 774, which may have a positive terminal and a negative terminal. The partially completed photovoltaic device 200 is electrically connected to the negative terminal of the second power source 774 and may act as a cathode in the second ECD unit 707. A second complementary electrode 762, which may be made of any appropriate electrode material known in the art, is electrically connected to the positive terminal of the second power source 774 and may act as an anode in the second ECD unit 705. In use, the second power source 774 generates an external ECD bias voltage across partially completed photovoltaic device 200 and second plating solution 722. The second power source 774 may have a second control unit 776, which may be capable of changing the ECD bias voltage across the partially completed photovoltaic device 200 and the second plating solution 722 during ECD. Solutes from second plating solution 722 are attracted to partially completed photovoltaic device 200 and form a second portion of the Cu or Sb doped zinc-based semiconductor layer 210 over the partially completed photovoltaic device 200. Then the partially completed photovoltaic device 200 is removed from the second plating solution 722.

Figure 8:
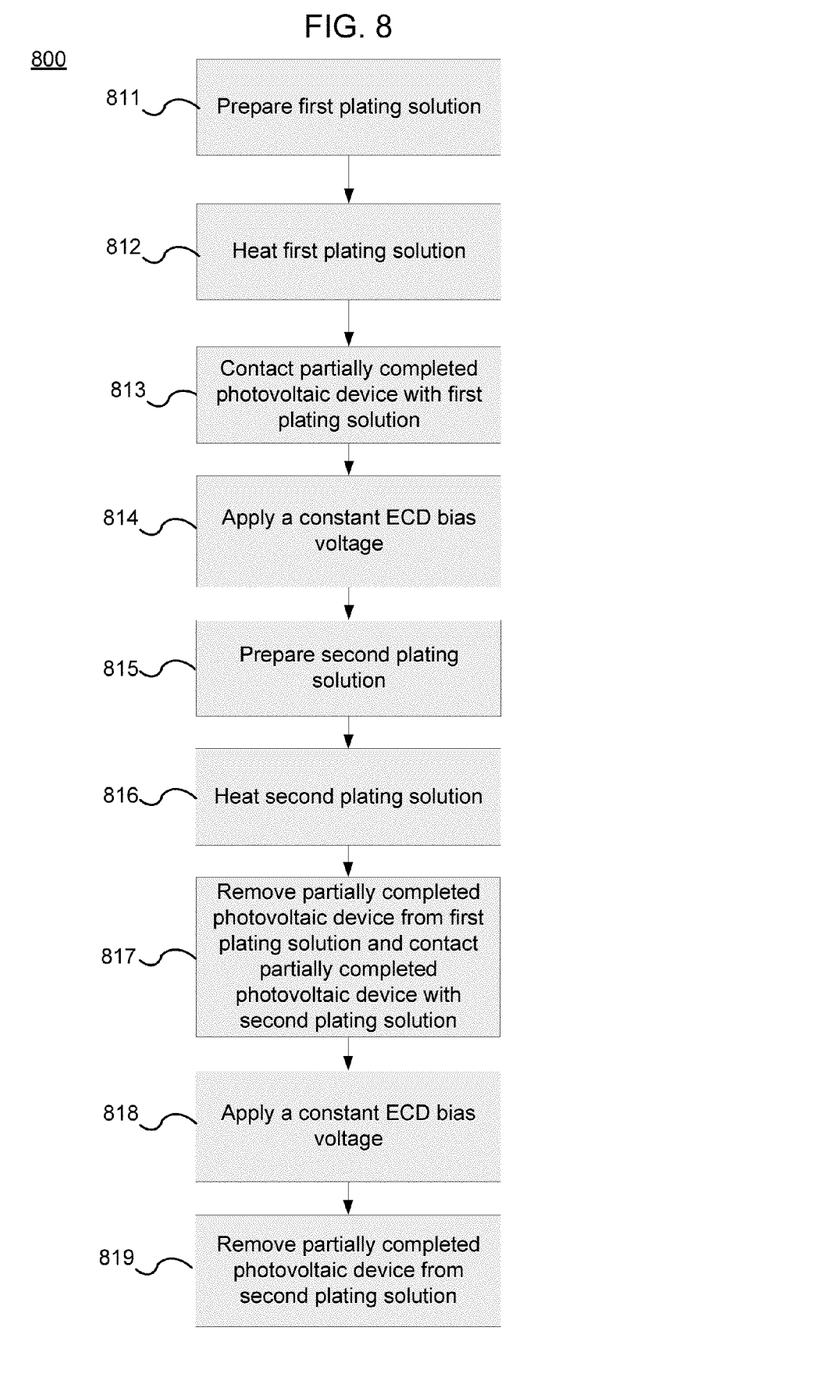
FIG. 8 illustrates a flow chart of an ECD plating process for incorporating a dopant into a zinc-based semiconductor layer as it is formed over a partially completed photovoltaic device using multiple plating baths with different plating solutions.

FIG. 8 illustrates a flow chart of an ECD plating process 800 with steps 811-819, where an ECD system 700, as shown in FIG. 7, may be used to change the amount of Cu or Sb dopant incorporated into a Cu or Sb doped zinc-based semiconductor layer 210 as it is plated using plating solutions with different compositions. In step 811, a first plating solution 720 is prepared, which may include a solvent, for example, water, a Cu or Sb dopant compound dissolved in the solvent, a complexing agent, for example, citrate, dissolved in the water and a zinc-based semiconductor solute mixture dissolved in the water. To form a Cu or Sb doped zinc-based semiconductor layer 210 that is a Cu:ZnTe or Sb:ZnTe reflector layer 150, the zinc-based semiconductor solute mixture may include, for example, zinc, and telluride ions or electrolytes, as a solute dissolved in the solvent, in a predetermined ratio for deposition of a Cu:ZnTe or Sb:ZnTe reflector layer 150. To form a Cu or Sb doped zinc-based semiconductor layer 210 that is a Cu:CZT or Sb:CZT transition layer 145, the zinc-based semiconductor solute mixture may include, for example, cadmium, zinc, and telluride ions or electrolytes, as a solute dissolved in the solvent, in a predetermined ratio for deposition of a Cu:CZT or Sb:CZT transition layer 145. The dopant concentration in the first plating solution 720 may be set based on whether a high or low amount of dopant is intended to be incorporated into the plated first portion of the Cu or Sb doped zinc-based semiconductor layer 210. If a low percentage of Cu or Sb dopant is desired to be incorporated into the first portion of the plated Cu or Sb doped zinc-based semiconductor layer 210, then the Cu or Sb dopant concentration in the first plating solution 720 may be, for example, in the range of about 0.01 mM to about 100 mM, which will result in about 0.0001% to about 3% incorporation of the Cu dopant or about 0.5% to about 12% incorporation of the Sb dopant into the first portion of the plated Cu or Sb doped zinc-based semiconductor layer 210 during a first portion of the plating process. If a high percentage of Cu or Sb dopant is desired to be incorporated into the first portion of the plated Cu or Sb doped zinc-based semiconductor layer 210, than, for example, the dopant concentration may be in the range of about 100 mM to about 10 M, which will result in about 3% to about 30% incorporation of the Cu dopant or about 12% to about 80% incorporation of the Sb dopant into the first portion of the plated Cu or Sb doped zinc-based semiconductor layer 210 during a first portion of the plating process. In step 812, first heater 715 heats the first plating solution 720 to a predetermined temperature for deposition of the Cu or Sb doped zinc-based semiconductor layer 210, for example, a temperature in the range of about 10° C. to about 100° C. In step 813, a partially completed photovoltaic device 200 is contacted with the heated first plating solution 720 in containing 710. In step 814, first power source 770 generates a suitable ECD bias voltage, for example, in the range of about −0.3 V to about −10 V across the partially completed photovoltaic device 200 and the first plating solution 720, which forms a first portion of the Cu or Sb doped zinc-based semiconductor layer 210 over the partially completed photovoltaic device 200.

In step 815, a second plating solution 722 is prepared with a Cu or Sb dopant concentration that is different than the Cu or Sb dopant concentration in the first plating solution 720. The second plating solution may include a solvent, for example, water, a Cu or Sb dopant compound dissolved in the solvent, a complexing agent, for example, citrate, dissolved in the water and a zinc-based semiconductor solute mixture dissolved in the water. To form a Cu or Sb doped zinc-based semiconductor layer 210 that is a Cu:ZnTe or Sb:ZnTe reflector layer 150, the zinc-based semiconductor solute mixture may include, for example, zinc, and telluride ions or electrolytes, as a solute dissolved in the solvent, in a predetermined ratio for deposition of a Cu:ZnTe or Sb:ZnTe reflector layer 150. To form a Cu or Sb doped zinc-based semiconductor layer 210 that is a Cu:CZT or Sb:CZT transition layer 145, the zinc-based semiconductor solute mixture may include, for example, cadmium, zinc, and telluride ions or electrolytes, as a solute dissolved in the solvent, in a predetermined ratio for deposition of a Cu:CZT or Sb:CZT transition layer 145. If the dopant concentration in the first plating solution 720 was set to incorporated a high percentage of Cu or Sb dopant into the first portion of the Cu or Sb doped zinc-based semiconductor layer 210, then the dopant concentration in the second plating solution 722 may be set to incorporate a low percent of Cu or Sb dopant, for example, in the range of about 0.01 mM to about 100 mM, which will result in about 0.0001% to about 3% incorporation of the Cu dopant or about 0.5% to about 12% incorporation of the Sb dopant into the second portion of the plated Cu or Sb doped zinc-based semiconductor layer 210 during the second portion of the plating process. If the dopant concentration in the first plating solution 720 was set to incorporated a low percentage of Cu or Sb dopant into the first portion of the Cu or Sb doped zinc-based semiconductor layer 210, then the dopant concentration in the second plating solution 722 may be set to incorporated a high percentage of Cu or Sb dopant, for example, in the range of about 100 mM to about 10 M, which will result in about 3% to about 30% incorporation of the Cu dopant or about 12% to about 80% incorporation of the Sb dopant into the second portion of the plated Cu or Sb doped zinc-based semiconductor layer 210 during a second portion of the plating process. In step 816, second heater 717 heats the second plating solution 722 to a predetermined temperature for deposition of a Cu or Sb doped zinc-based semiconductor layer 210, for example, a temperature in the range of about 10° C. to about 100° C. In step 817, the partially completed photovoltaic device 200 is removed from the first plating solution 720 and contacted with a second plating solution 722. In step 818, a second power source 774 generates an ECD bias voltage, for example, in the range of about −0.3 V to about −10 V, across the partially completed photovoltaic device 200 and the second plating solution 722.

Depositing the Cu or Sb doped zinc-based semiconductor layer 210 using multiple plating baths with different Cu or Sb dopant concentrations in the different plating solutions changes the amount of the Cu or Sb dopant into the Cu or Sb doped zinc-based semiconductor layer 210 in a step-wise fashion. It should be noted that although steps 811-818 describe using only two separate plating baths, any desirable number of plating baths with different Cu or Sb dopant concentrations may be used to provide the desired steps of Cu or Sb dopant incorporation into the plated Cu or Sb doped zinc-based semiconductor layer 210 and the steps of distinct dopant incorporation into the plated Cu or Sb doped zinc-based semiconductor layer 210 will correspond to the number of baths used in the plating process. In step 819, the partially completed photovoltaic device 200 with the newly plated Cu or Sb doped zinc-based semiconductor layer 210 is removed from the second plating solution 722. Again, it should be noted that the steps 811-819 shown in FIG. 5 describe the steps in ECD plating process 800, but do not necessarily indicate any particular order or sequence of steps.

The embodiments described above are offered by way of illustration and example. It should be understood that the examples provided above may be altered in certain respects and still remain within the scope of the claims. It should be appreciated that, while the invention has been described with reference to the above exemplary embodiments, other embodiments are within the scope of the claims.

What is claimed as new and desired to be protected by Letters Patent of the United States is:

1. A method of manufacturing a photovoltaic device, the method comprising:
    forming a first plating solution comprising a dopant, a complexing agent and a zinc-based semiconductor solute, wherein the complexing agent is at least one of citrate, phenathroline, thiocyanate, halides, pyridines or their derivatives;
    contacting at least one surface of a partially completed photovoltaic device with the first plating solution;
    electrically connecting the partially completed photovoltaic device to a power source; and
    forming at least a first portion of a doped zinc-based semiconductor layer on the partially completed photovoltaic device from the first plating solution using electrochemical deposition by generating a bias voltage across the partially completed photovoltaic device and the first plating solution for a predetermined period of time.

2. The method of claim 1, wherein the dopant comprises a copper (Cu) dopant or an antimony (Sb) dopant.

3. The method of claim 1, wherein the semiconductor solute comprises solutes of zinc (Zn) and telluride (Te).

4. The method of claim 1, wherein the semiconductor solute comprises solutes of cadmium (Cd), zinc (Zn) and telluride (Te).

5. The method of claim 1, wherein the dopant concentration in the first plating solution is in the range of about 0.01 mM to about 10 M.

6. The method of claim 1, wherein the dopant concentration in the first plating solution is in the range of about 5 mM to about 50 mM.

7. The method of claim 1, further comprising heating the first plating solution to a temperature in the range of about 10° C. to about 100° C.

8. The method of claim 1, wherein the bias voltage generated across the partially completed photovoltaic device and the first plating solution is in the range of about −0.3 V to about −3 V.

9. The method of claim 1, wherein the doped zinc-based semiconductor layer comprises a doped zinc telluride layer or a doped cadmium zinc telluride layer.

10. The method of claim 1, further comprising changing an amount of dopant incorporated from the first plating solution into the doped zinc-based semiconductor layer by changing the bias voltage as the doped zinc-based semiconductor layer is formed on the partially completed photovoltaic device.

11. The method of claim 10, wherein changing the bias voltage comprises changing the bias voltage from a first set bias voltage of about −0.9 V to a second set bias voltage of about −1.2 V during the predetermined period of time for forming the doped zinc-based semiconductor layer on the partially completed photovoltaic device.

12. A method of manufacturing a photovoltaic device, the method comprising:
    forming a first plating solution comprising a dopant, a complexing agent and a zinc-based semiconductor solute, wherein the complexing agent is at least one of citrate, phenathroline, thiocyanate, halides, pyridines or their derivatives;
    forming at least a first portion of a doped zinc-based semiconductor layer on a partially completed photovoltaic device from the first plating solution using electrochemical deposition;
    removing the partially completed photovoltaic device from the first plating solution;
    forming a second plating solution comprising a dopant, a complexing agent and a zinc-based semiconductor solute, wherein the second plating solution has a different composition than the first plating solution; and
    forming a second portion of the doped zinc-based semiconductor layer on the partially completed photovoltaic device from the second plating solution using electrochemical deposition.

13. The method of claim 12, wherein forming the second portion of the doped zinc-based semiconductor layer further comprises:
    contacting the at least one surface of the partially completed photovoltaic device with the second plating solution;
    electrically connecting the partially completed photovoltaic device to the power source; and
    forming the second portion of the doped zinc-based semiconductor layer on the partially completed photovoltaic device by generating a bias voltage across the partially completed photovoltaic device and the second plating solution for a predetermined period of time.

14. The method of claim 13, wherein the dopant concentration in the first plating solution is different than the dopant concentration in the second plating solution.

15. The method of claim 14, wherein the dopant concentration in the first plating solution is in the range of about 0.01 mM to about 100 mM and the dopant concentration in the second plating solution is in the range of about 100 mM to about 10 M.

16. The method of claim 14, wherein the dopant concentration in the first plating solution is in the range of about 100 mM to about 10 M and the dopant concentration in the second plating solution is in the range of about 0.01 mM to about 100 mM.

17. The method of claim 14, wherein the first and second plating solution further comprise solutes of zinc (Zn) and telluride (Te).

18. The method of claim 14, wherein the first and second plating solutions further comprise solutes of cadmium (Cd), zinc (Zn) and telluride (Te).

19. The method of claim 14, further comprising heating the first and second plating solutions to a temperature in the range of about 10° C. to about 100° C.

20. The method of claim 14, wherein the bias voltage generated across the partially completed photovoltaic device and the first plating solution is in a range of about −0.3 V to about −3 and the bias voltage generated across the partially completed photovoltaic device and the second plating solution is in a range of about −0.3 V to about −3 V.

* * * * *